United States Patent
Chu et al.

(10) Patent No.: US 8,736,021 B2
(45) Date of Patent: May 27, 2014

(54) SEMICONDUCTOR DEVICE COMPRISING A METAL SYSTEM INCLUDING A SEPARATE INDUCTOR METAL LAYER

(75) Inventors: Tsui Ping Chu, Kuching (MY); Hyung Sun Yook, Kuching (MY); Poh Ching Sim, Kuching (MY)

(73) Assignee: X-FAB Semiconductor Foundries AG, Erfurt (DE)

( * ) Notice: Subject to any disclaimer, the term of this patent is extended or adjusted under 35 U.S.C. 154(b) by 18 days.

(21) Appl. No.: 13/375,062

(22) PCT Filed: May 15, 2009

(86) PCT No.: PCT/IB2009/052041
§ 371 (c)(1),
(2), (4) Date: Nov. 29, 2011

(87) PCT Pub. No.: WO2010/131079
PCT Pub. Date: Nov. 18, 2010

(65) Prior Publication Data
US 2012/0068303 A1    Mar. 22, 2012

(51) Int. Cl.
*H01L 29/00* (2006.01)
*H01L 23/522* (2006.01)
*H01L 23/64* (2006.01)

(52) U.S. Cl.
CPC .......... *H01L 23/5227* (2013.01); *H01L 23/645* (2013.01)
USPC ..... 257/531; 257/528; 257/762; 257/E29.325

(58) Field of Classification Search
CPC .......................... H01L 23/5227; H01L 23/645
USPC ............ 257/762, 78–759, 774; 438/614–624, 438/128–129, 329, 381, 626–627, 631, 685
See application file for complete search history.

(56) References Cited

U.S. PATENT DOCUMENTS

| | | | |
|---|---|---|---|
| 6,573,148 B1 | 6/2003 | Bothra | |
| 6,717,232 B2 | 4/2004 | Bothra | |
| 7,053,460 B2 * | 5/2006 | Volant et al. | 257/531 |
| 2003/0116850 A1 | 6/2003 | Volant et al. | |
| 2008/0079114 A1 | 4/2008 | Cho et al. | |

OTHER PUBLICATIONS

Lee, Seung Joo; International Search Report; PCT/IB2009/052041; Feb. 17, 2010; pp. 1-4; Korean Intellectual Property Office; Daejeon, Republic of Korea.
Chatel, Cecile; International Preliminary Report on Patentability with Written Opinion; PCT/IB2009/052041; Nov. 15, 2011; pp. 1-6; The International Bureau of WIPO; Geneva, Swtizerland.

* cited by examiner

*Primary Examiner* — Dung Le
(74) *Attorney, Agent, or Firm* — Stevens & Showalter LLP

(57) ABSTRACT

In an integrated circuit an inductor metal layer is provided separately to the top metal layer, which includes the power and signal routing metal lines. Consequently, high performance inductors can be provided, for instance by using a moderately high metal thickness substantially without requiring significant modifications of the remaining metallization system.

15 Claims, 3 Drawing Sheets

Figure 1A:
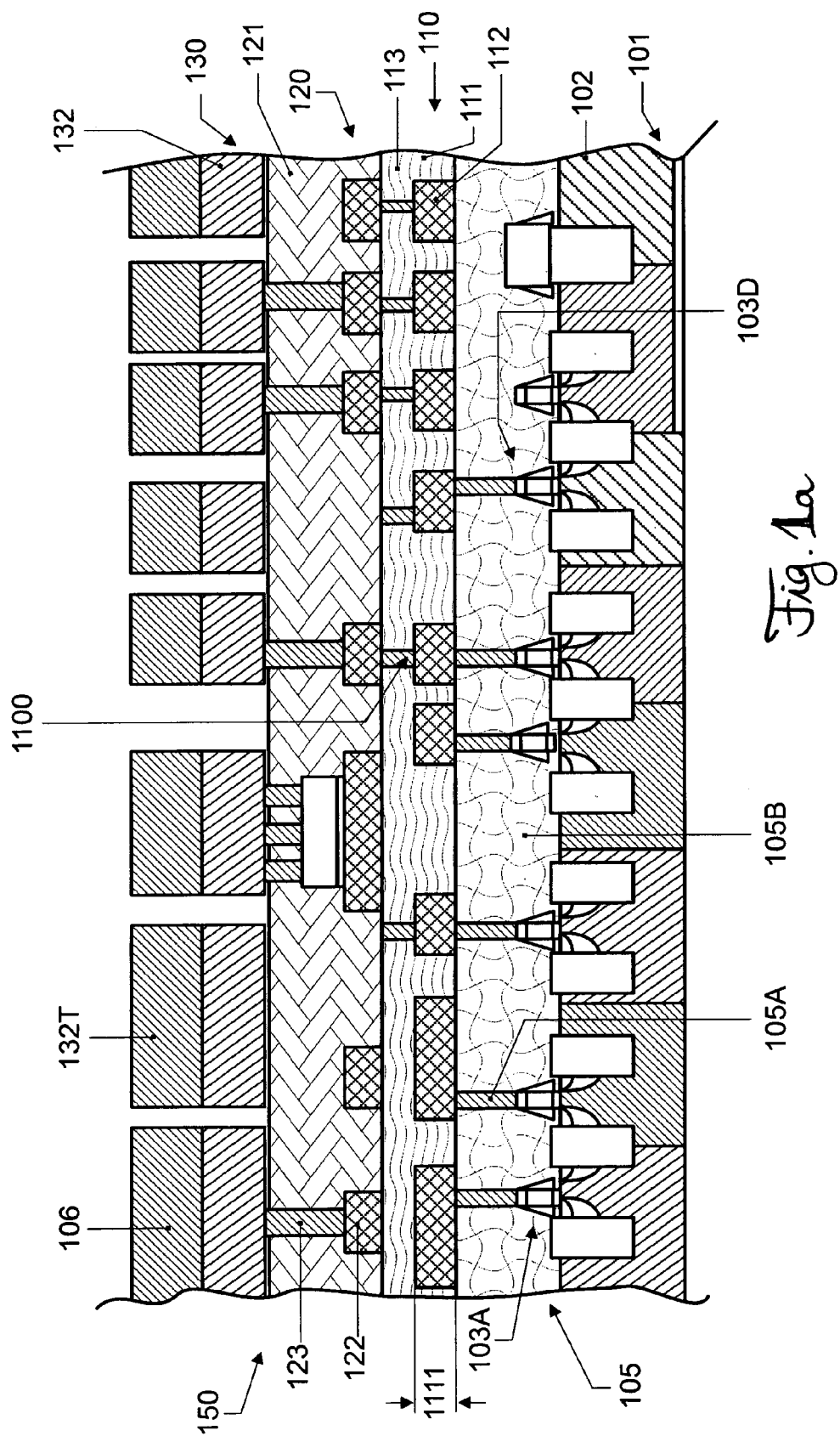

SEMICONDUCTOR DEVICE COMPRISING A METAL SYSTEM INCLUDING A SEPARATE INDUCTOR METAL LAYER

FIELD OF THE INVENTION

The present invention generally relates to semiconductor devices, wherein passive components, such as inductors and the like are formed in the metallization system of the semiconductor device, for instance for semiconductor devices comprising a mixed signal circuitry, i.e., analogue circuitry and digital circuitry in a single chip.

DESCRIPTION OF THE RELATED ART

Integrated circuits include typically a plurality of circuit elements that are formed in and above an appropriate semiconductor layer, such as a silicon layer or any other appropriate semiconductor material. Due to the ongoing shrinkage of critical dimensions of the individual circuit elements, the overall packing density has been continuously increased, thereby providing the possibility to also increase functionality of the integrated circuits. Typically, in the fabrication process for forming the circuit elements in and above the semiconductor layer, usually a silicon layer, a plurality of lithography processes are subsequently be performed in order to define certain components of the circuit elements on the basis a masking regime obtained by the respective lithography process. For instance, resist materials may be used to form a mask layer, which in turn is then used as an etch mask, an implantation mask, a deposition mask, and the like so as to locally provide a desired material, adjust material characteristics as is required by the overall circuit layout. Thus based on a given lithography mask or level a plurality of interrelated manufacturing processes is performed, followed by another lithography process performed that is spatially related to the preceding lithography process and the corresponding device features obtained from the plurality of previously performed interrelated manufacturing processes. Hence, the basic semiconductor features are completed by performing a plurality of lithography processes and associated manufacturing processes, wherein each lithography process is typically performed on the basis of a corresponding critical dimension, which represents the minimum feature size that may be consistently be produced for given processes required for the level under consideration and the associated process variations. That is, upon designing the layout of the integrated circuit under consideration the critical dimensions of the various device levels have to be taken into consideration for the various processes involved in the device level so as to meet appropriately defined specifications and corresponding device margins.

This is typically accomplished by establishing specific "design rules" for each device level, which thus ensures that respective dimensions of features, such as the spacing between two neighbouring lines or trenches, the width and/or the length of lines, the depth of trenches and the like are within the specifications.

For example, when a material layer is etched so as to form trenches therein that require a certain "minimum" spacing, the depth of these trenches may not arbitrarily be increased, for instance by increasing the initial layer thickness of the material under consideration, since the capabilities of the deposition and etch processes involved may not be appropriate for reliably maintaining the desired minimum spacing, without significant changes of one or more of the recipes of these manufacturing processes. However, a respective change of the process recipes may require significant research and development efforts that may not be compatible with the overall production policy in terms of throughput and the like.

Due to the continuous shrinkage of the feature sizes of the circuit elements an increased diversity of electronic functions is frequently integrated into a single semiconductor chip, thereby also requiring a complex wiring regime for interconnecting the various circuit elements. For this purpose one or more metal layers are provided, which include metal lines filled with an appropriate metal, such as aluminum, copper and the like. The metal lines of one metal layer are electrically connected to the metal lines of a neighbouring metal line of the stacked metallization system by "vertical" interconnects that are typically referred to as vias. When forming the metallization system of an integrated circuit also complex patterning regimes have to be applied to form each of the metal layers and via layers on the basis of tightly set design rules. For example, a metal layer, such as an aluminum/copper alloy may have to be deposited and patterned so as to obtain the metal lines which have to meet respective requirements with respect to lateral dimensions, conductivity, and the like. When a certain metal layer has to provide for a drive current capability, for instance, the thickness of the initial metal layer and the lateral dimension, i.e., the width, of the metal lines have appropriately to be adapted to each other so as to meet the conductivity requirements and at the same time provide for the desired layout of the metal layer under consideration. Thus, frequently two different thickness values for the metal layers are used, depending on the overall device requirements. For metal layers next to the device level, in which the semiconductor devices, such as transistors and the like, are formed, a first reduced thickness, for example, in the range of approximately 400 nm (nanometer) may be used, while an increased thickness, for instance approximately 800 nm may be used for the uppermost or top metal layer, which includes the signal routing and the power rails. Thus, the metal layers are fabricated on the basis of different design rules, which correlate the initial layer thickness with the lateral dimensions for a given patterning strategy.

In many cases the basic layout of the integrated circuit under consideration requires the provision of inductive components, which are typically formed in the top metal layer. For example, in mixed signal circuits, i.e., in integrated devices comprising analogue and digital circuitry, the corresponding inductors are formed in the top metal layer by applying the design rules associated with the top metal layer. As explained above, for given design rules the initial thickness of the top metal layer may not arbitrarily be increased for given lateral dimensions, as it would be desirable in view of enhancing the conductivity of the individual inductor sections so as to obtain a higher quality or Q factor of the inductor, unless also the lateral size of the metal features is increased according to the given design rules. Thus, for a desired conductivity of the inductors in the top metal layer the thickness of the metal has to be increased, for instance up to approximately 2000 nm, thereby also requiring a corresponding increase of the lateral dimensions of the inductor components, which in turn significantly contributes to the overall lateral size of the integrated circuit.

In view of the situation described above it is an object of the present invention to provide a device and a method for reducing area consumption in integrated circuits requiring inductors in the metallization system.

SUMMARY OF THE INVENTION

According to one aspect of the present invention the object is solved by an integrated circuit. The integrated circuit comprises a plurality of semiconductor circuit elements formed in and above a semiconductor layer that is formed above a substrate. Moreover, one or more first metal layers are formed above said semiconductor layer and comprise metal lines having a first thickness. The integrated circuit further comprises a second metal layer formed above said one or more first metal layer and comprising power and signal routing lines having a second thickness that is greater than said first thickness. Additionally, the integrated circuit comprises one or more inductor metal layers formed above the semiconductor layer, wherein the one or more inductor metal layers comprise inductor metal lines forming one or more inductors and having a third thickness that is greater than said second thickness.

The integrated circuit of the present invention has a metallization system, in which the requirements for inductors and the signal and power routing metal lines are individually met without consuming undue semiconductor area of the chip. That is, by separating the power and signal routing lines from the inductors both types of metal features can be fabricated with enhanced flexibility and thus reduced area consumption, since appropriate design rules may be used for each separate metal layer. In this manner, the Q factor of the inductors can be adjusted so as to comply with performance requirements of the integrated circuit, for instance by appropriately selecting the metal thickness, while well-established design and manufacturing strategies may still be used for providing the power and signal routing metal lines.

In one preferred embodiment each of the one or more inductor metal layers is positioned above the second metal layer. In this case, the metal system may be formed with a high degree of compatibility with existing circuit layouts of complex integrated circuits, while the required inductors may efficiently provided in additional metal layers above the "final" metal layer without requiring undue modifications in the lower lying metal layers.

In a further embodiment one of the one or more inductor metal layers is positioned below the second metal layer. Hence, the inductor metal layers can be "distributed" across the stacked metallization system, while nevertheless the non-inductor metal layers may be formed on the basis of well-established design rules. On the other hand if desired, one or more inductors can be positioned closer to the device level, i.e., the semiconductor circuit elements, which may be advantageous, for instance, when the inductors are to be used for ESD (electrostatic discharge) protection, and the like.

In a further embodiment a ratio defined by the third thickness and a minimum lateral dimension used in the one or more inductor metal layers is greater than a ratio defined by the second thickness and a minimum lateral dimension used in the second metal layer. In this case, the design rules of these metal layers are selected differently so that a compact size of the device can be achieved due to using a desired compact layout for the signal and power routing while also providing for enhanced performance of the inductors by selecting an appropriate thickness and lateral dimensions of the metal lines.

In a further embodiment two or more inductor metal layers are provided. Hence, a high degree of flexibility in adding inductive components is achieved while substantially maintaining well-established circuit layouts in the remaining metal layers.

In a further embodiment at least two of the two or more inductor metal layers have metal lines with a different thickness. That is, the respective metal thickness values may be selected individually in the inductor metal layers so as to comply with requirements in view of overall area consumption of the inductors, performance, and the like.

In a further embodiment the third thickness is 3 µm (micrometer) or more, while in other embodiments the third thickness is 4 µm or more. Hence, high conductivity and thus a high Q factor is obtained.

In a further embodiment the plurality of semiconductor devices are part of a circuitry that comprises an analogue circuit portion and a digital circuit portion. Hence, the digital circuit portion and the analogue circuit part can be designed on the basis of well-established design techniques while the required inductors may efficiently be implemented in the metallization system substantially without requiring changes of the original metal system of the digital circuitry. Thus, adding inductor modules to the design kit package may be accomplished without changes of the other design modules.

In a further embodiment a lateral dimension of the integrated circuit is defined by the plurality of semiconductor devices formed in and above the semiconductor layer and by the first and second metal layers. Consequently, the basic compact circuit dimensions may substantially maintained when corresponding inductors are to be added, for instance for mixed signal application, ESD protection, in which the inductors may act as frequency dependent discharge paths, and the like.

According to a further aspect of the present invention, a method for forming a metallization system of an integrated circuit is provided. The method comprises forming a metal layer above a substrate wherein the metal layer comprises power and signal routing metal lines having a specified thickness. Furthermore the method comprises forming an inductor metal layer above the substrate, wherein the inductor metal layer includes inductor metal lines having a thickness that is greater than the specified thickness.

As discussed above, also in this case an efficient manufacturing strategy may be provided, in which the thickness and thus performance of the inductors is achieved individually and separately with respect to any requirements concerning metal lines of the remaining metallization system. In further embodiments the inductor metal layer is formed on the basis of a different design rule compared to the metal layer and any additional intermediate metal layers, which may be formed between the metal layer and the substrate. Consequently, as already discussed above, complex circuit layouts, for instance based on mixed signal circuitries, may be formed by using well-established design tools and strategies, while performance of the inductors is ensured without requiring significant changes in other metal layers, such as the metal layer including the power and signal routing metal lines.

INTRODUCTION TO THE FIGURES

Figure 1B:
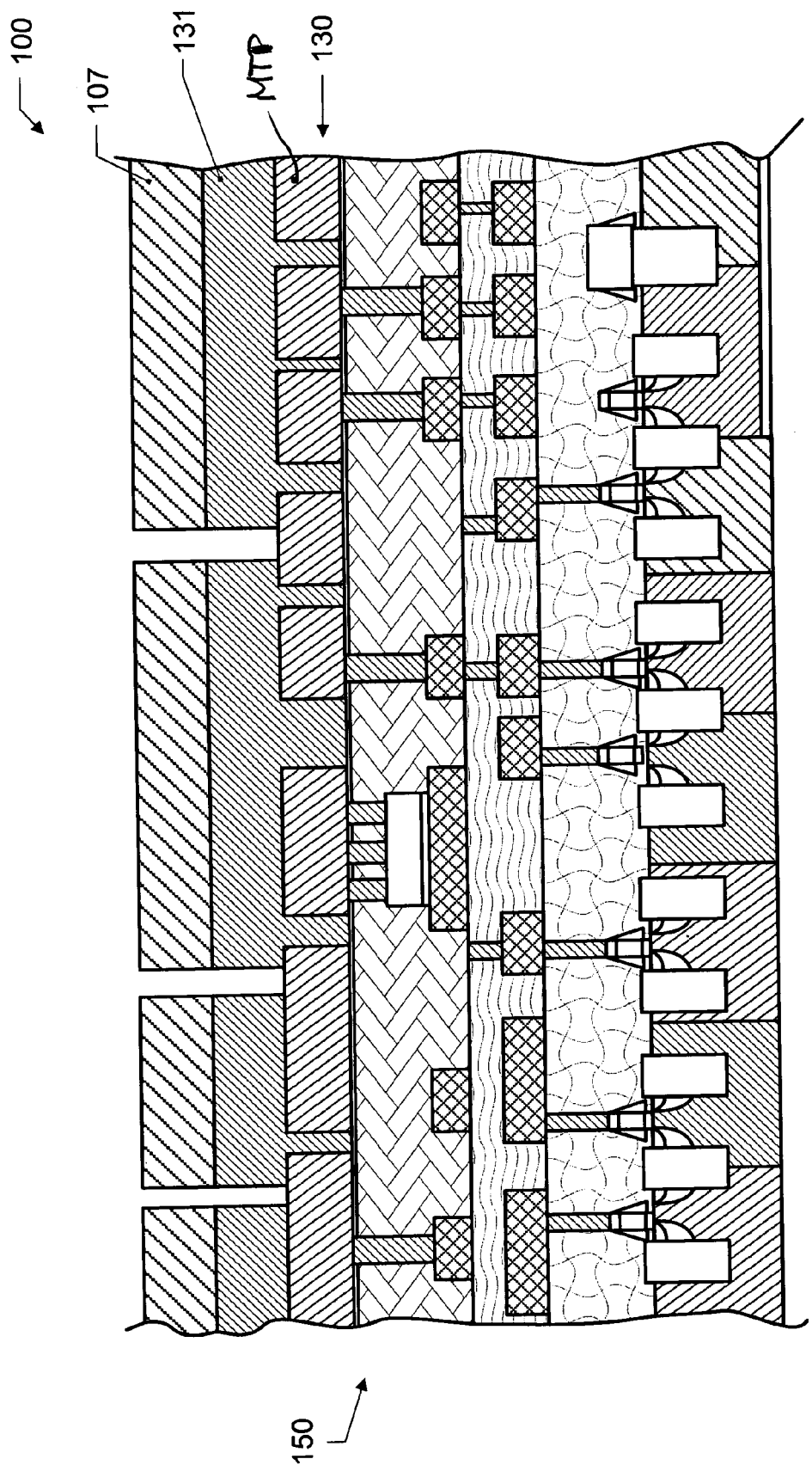
Figure 1C:
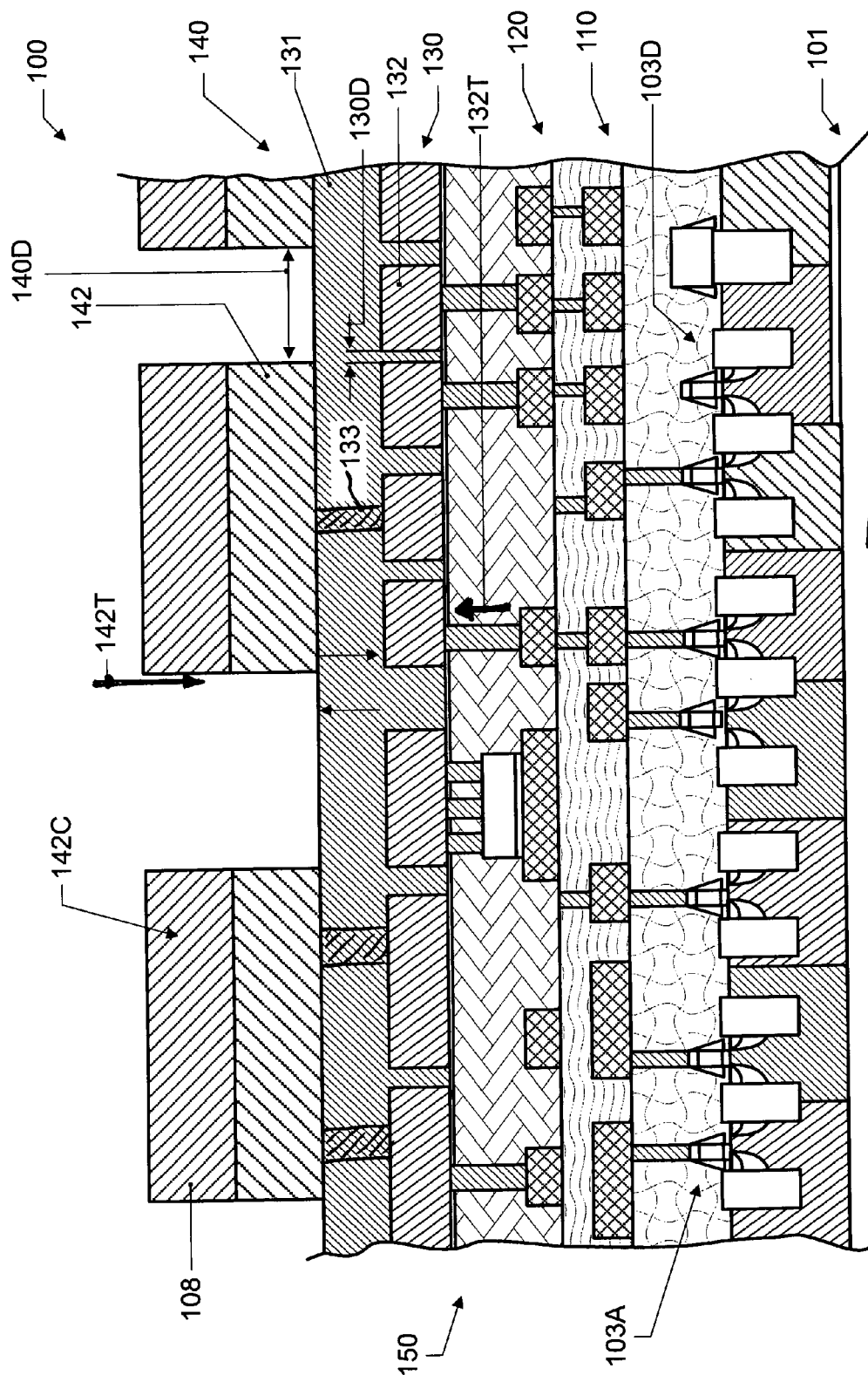

Further advantageous embodiments are also described in the appended dependent claims and in the following detailed description, in which reference is also made to the accompanying drawings, in which:

FIGS. 1a to 1c schematically illustrate cross-sectional views of an integrated circuit during various manufacturing stages, wherein a metallization system is provided that includes one or more separate inductor metal layers.

DETAILED DESCRIPTION

FIG. 1a schematically illustrates a cross-sectional view of a portion of a semiconductor device or integrated circuit 100. The integrated circuit 100 is illustrated in an advanced manufacturing stage in which a plurality of circuit elements 103a, 103*d*, such as semiconductor-based circuit elements in the form of transistors, capacitors and the like, are formed in and above a semiconductor layer 102, such as a silicon layer, which in turn is positioned above a substrate 101, which may represent any appropriate carrier material. For example, the substrate 101 may represent, in combination with the semiconductor layer 102, a crystalline semiconductor substrate, an SOI (silicon on insulator) configuration and the like. In one illustrative embodiment the circuit elements 103*a* define an analogue circuit portion of the integrated circuit 100, while the circuit elements 103*d* define a digital circuit portion. In this case, the integrated circuit 100 may represent a device for mixed signal applications in which analogue signals are processed in the analogue circuit portion represented by the circuit elements 103*a*, while a digital signal processing may be accomplished by means of the circuit portion represented by the circuit elements 103*d*. The circuit elements 103*a*, 103*d* are electrically connected to a metallization system 150 by means of a contact structure 105, which comprises corresponding contact elements 105*a* that are formed in an appropriate dielectric material 105*b*, such as silicon dioxide, silicon nitride and the like. The contact elements 105*a*, such as tungsten filled elements, connect to a first metal layer 110, which is comprised of a dielectric material 111, such as silicon dioxide, possibly in the form of a fluorine doped silicon dioxide material, and corresponding metal lines 112, such as aluminium lines, aluminium/copper alloy lines and the like. Moreover, in the embodiment shown, a further metal layer 120 is formed above the metal layer 110 and is connected thereto by corresponding vias 113, which may be tungsten filled elements possibly in combination with a glue metal or barrier layer.

In this respect it is to be noted that any statements with respect to a position of any components of the device 100 is to be understood as a relative position with respect to the substrate 101. That is, position information, such as "above", "below", "on", "lateral", "vertical", and the like are to be referred to the substrate 101. Hence, a first component is positioned "above" a second component when a distance of the second component to the substrate 101 is less than a distance of the first component to the substrate 101. In this sense, the metal layer 120 is positioned "above" the metal layer 110.

The metal layer 120 comprises a dielectric material 121, such as silicon dioxide, and corresponding metal lines 122. Furthermore, a "final" or top metal layer 130 is formed above the metal layer 120 and is electrically connected thereto by vias 123. The metal layer 130 is shown in an intermediate manufacturing stage in which metal lines 132 are already patterned on the basis of a corresponding etch mask 106. That is, the etch mask 106 comprises corresponding resist features that substantially correspond to the metal lines 132 of the metal layer 130.

The integrated circuit 100 as illustrated in FIG. 1*a* may be formed on the basis of the following process strategy. First, the circuit elements 103*a*, 103*d* are fabricated by using well-established manufacturing techniques in order to obtain transistors, capacitors and resistors in accordance with the overall circuit design of the integrated circuit 100. Thereafter, the dielectric material 105*b* of the contact structure 105 is deposited and subsequently patterned in order to obtain openings for the contact elements 105*a*, which are then filled with a conductive material by depositing, for instance tungsten, possibly in combination with an appropriate barrier material, such as titanium nitride and the like. After removing any excess material, for instance by CMP (chemical mechanical polishing), the metal layer 110 is formed, for instance by depositing an appropriate metal, such as aluminium, aluminium/copper alloy and the like, which is patterned by established etch techniques.

As previously discussed, the metal lines 112 are to be formed on the basis of a corresponding patterning strategy and associated design rules, which typically provide for the required number of metal lines 112 having appropriate lateral dimensions in order to obtain a desired density of interconnect structures as required for electrically connecting the circuit elements 103*a*, 103*d*. Consequently, as previously explained, a minimum distance, for instance a distance 110*d*, may be demanded by the corresponding design rules for the layer 110, wherein the distance 110*d* may also depend on a thickness 112*t* of the metal lines 112, since the patterning techniques involved as the photolithography processes and the associated etch techniques, may allow a certain minimum distance 110*d* for a specified range of thickness values 112*t* only. Thus, the corresponding design rules for the layer 110 are selected so that a desired thickness 112*t* in combination with a minimum distance 110*d* may reliably be produced for given process techniques so as to meet the requirements with respect to performance of the metal lines 112 and the desired density of interconnect structures in the metallization system 150, which may thus also determine the overall lateral dimensions of the integrated circuit 100.

Similarly, the metal layer 120 is formed on the basis of corresponding design rules, which may be identical to the design rules of the layer 110, if similar requirements with respect to performance of the metal lines 122 are to be fulfilled. In other cases, different design rules may be used, depending on the overall device requirements. Prior to forming the metal layer 120, the vias 113 are formed, for instance by depositing an appropriate dielectric material above the patterned metal lines 112 and patterning the dielectric material so as to obtain openings which are subsequently filled with an appropriate metal such as tungsten. Similarly, the vias 123 are formed after patterning the metal lines 122 by depositing the dielectric material 121 and forming openings therein. Thereafter the barrier material, such as titanium, titanium nitride, and the like is deposited and tungsten is filled into the openings that are coated by the barrier material. After removing any excess material and planarizing the overall surface topography, a metal is deposited for the metal lines 132 and is patterned on the basis of the etch mask 106. The metal layer 130 represents a metal layer in which signal routing and power metal lines are to be provided as is required for the base circuit function of the device 100. Since typically increased current densities are to be used in the layer 130 during operation of the device 100, the metal lines 132 may have an increased cross-sectional area. This may be accomplished by providing an increased initial thickness 132*t* of the corresponding metal layer used for patterning the metal lines 132. Thus, as previously explained, an appropriate design rule is established for obtaining the metal lines 132 in accordance with the desired layout so as to obtain the required lateral dimensions of lines and spaces in the layer 130, while also the required performance, ie. conductivity, is achieved due to the appropriately selected thickness of the lines 132. For instance, the thickness 132*t* may be in the range of 800 nm and more, when a thickness of the intermediate metal layers 110, 120 is approximately 400 nm and more. It should be appreciated, however, that any other appropriate values for the thickness of the metal lines 112, 122 and 132 may be selected, depending on performance criteria for the device 100.

FIG. 1*b* schematically illustrates the integrated circuit 100 in a further advanced manufacturing stage, in which a dielectric material 131 is formed between and above the metal lines 132 and a corresponding etch mask 107 is formed on the dielectric material 131, thereby defining corresponding openings therein, which represent respective vias to connect to one or more further metal layers, which may include inductors as required for the overall function of the integrated circuit 100. The dielectric material 131 can be deposited by any well-established deposition technique, such as CVD (chemical vapour deposition), plasma enhanced CVD and the like, followed by depositing a resist material, possibly in combination with any ARC (antireflective coating) materials, which is then patterned by photolithography. Based on the etch mask 107, the dielectric material 131 is etched using, for instance, fluorine-based etch chemistries. Thereafter, the etch mask 107 is removed and a conductive barrier material, such as titanium, titanium nitride and the like, is deposited, for instance by CVD, sputter deposition and the like. Next, an appropriate metal such as tungsten may be deposited, for instance by CVD, in order to fill the corresponding openings in the dielectric material 131. Thereafter, any excess material is removed, for instance by CMP similar as described with reference to the metal layer 120 when forming the vias 123.

FIG. 1c schematically illustrates the integrated circuit 100 in a further advanced manufacturing stage in which corresponding vias 133 are formed in the dielectric material 131 of the metal layer 130 so as to electrically connect to a further metal layer 140, which is also referred to as an inductor metal layer since at least some of the metal lines 142 of the layer 140 represent corresponding conductor portions of inductors which, are referred to as inductors 142c. As illustrated, the metal lines or inductor metal lines 142 have a specified thickness 142t, which is selected so as to obtain the required overall conductivity, which in turn may result in a desired quality or Q factor of the corresponding inductors 142c. For example, the thickness 142t may significantly be greater compared to the thickness 132t of the metal lines 132 of the metal layer 130 comprising the power and signal routing lines of the integrated circuit 100. For example, in some illustrative embodiments, the thickness 142t is approximately 3 µm and more, such as 4 µm and more. Furthermore, a minimum distance 140d of neighbouring metal lines 142 is selected in accordance with the overall device requirements, for instance in view of the patterning capabilities of the involved patterning technique for a desired thickness 142t and also with respect to the overall lateral size of the metallization system 150 and parasitic capacitance values between adjacent metal lines 142. In advantageous embodiments, the design rules for the layer 140 are selected such that a high performance of the inductors 142c is accomplished, while at the same time a compact lateral size of the integrated circuit 100 is maintained, wherein in some illustrative embodiments the lateral dimensions are defined by the layout of the circuit elements 103a, 103d and the remaining metal layers 110, 120 and 130. That is, for a basic circuit configuration the addition of the inductors 142c may thus not result in an increased area of the substrate 101 compared to a circuit design, in which no inductors would be implemented. In other words, a significant reduction of the required semiconductor area may be achieved by providing the inductor 142c in a separate metal layer compared to conventional strategies, in which the required inductors are incorporated into the final metal layer that also includes the signal and power routing lines.

In some illustrative embodiments which are not explicitly illustrated in the drawings, one or more further metal layers, such as the layer 140, including inductor elements are formed in the metallization system 150 so as to allow the provision of high performance inductors as inductors having metal lines with a large cross-sectional area, while not unduly adding to the overall lateral size of the integrated circuit 100. Furthermore, it should be appreciated that at least some of the one or more additional inductor metal layers may be formed on the basis of different design rules compared to the corresponding design rules as are used for forming the metal layer 140 as illustrated. That is, the thickness 142t and/or the minimum distance 140d of the one or more additional inductor metal layers may be selected differently, thereby providing for a high degree of flexibility in positioning corresponding inductor elements within the metallization system 150.

The inductor metal layer 140 may be formed by depositing a metal material having the desired thickness 142t, followed by the deposition of a mask material, such as a resist material, which is patterned into the etch mask 108 on the basis of well-established lithography techniques, as is also previously described. Next, the metal material is patterned on the basis of the etch mask 108, thereby obtaining the inductor metal lines 142 on the basis of the corresponding design rule. For example, the ratio defined by the thickness 142t and the minimum lateral distance 140d used in the layer 140 is different and specifically adapted to the inductor 142c, and is higher compared to the corresponding ratio defined by the thickness 132t and a corresponding minimum distance 130d of the metal layer 130. After the etch process the resulting structure may be cleaned by using well-established wet chemical cleaning recipes in order to remove etch related byproducts. Thereafter, the further processing may be continued by depositing an appropriate dielectric material and any passivation material.

In some illustrative embodiments two or more of the layers 140 are provided in the metallization system 150, as already discussed above. In this case, one of these layers may not necessarily be formed above the layer 130 but may be positioned within the intermediate metal layers 110, 120, depending on the configuration of the corresponding inductor metal layer 140 and the overall device and process requirements. For example, if close proximity of the corresponding inductors of the intermediate inductor metal layer to the circuit elements 103a, 103d is required, for instance with respect to enhanced overall performance, the corresponding inductor metal layer may be positioned on the first metal layer 110 or on the contact structure 105, wherein a corresponding layout of the respective inductors may be selected such that vertical vias, such as the vias 113, can still be formed in an appropriate manner so as to provide for the required electrical connection within the metallization system 150. In other illustrative embodiments, two or more inductor metal layers, such as the layer 140, may be stacked on top of each other and may commonly be provided above the layer 130, thereby allowing a high degree of compatibility with conventional metallization systems while nevertheless providing for an overall compact lateral size and high performance of the metallization system 150 in combination with a high degree of flexibility in forming the integrated circuit 100.

As a consequence, the present invention provides integrated circuits and manufacturing techniques for forming a metallization system in which inductors have high performance based on a moderately high metal thickness. For this purpose the inductors are provided in separate metal layers, which may thus be formed on the basis of specific design rules which may be different from design rules used in the non-inductor metal layers. Thus, the power and signal routing within the metallization system may be accomplished by using design kit packages for non-inductor devices without any changes and adding the corresponding inductor modules, thereby providing for an efficient design procedure. Furthermore, by providing one or more separate inductor metal layers an overall compact die size can be achieved, since one or more inductors may be distributed over a plurality of dedicated inductor metal layers, if required.

We claim:

1. An integrated circuit comprising:
   a plurality of semiconductor circuit elements formed in and above a semiconductor layer formed above a substrate;
   one or more first metal layers formed above said semiconductor layer, said one or more metal layers comprising metal lines having a first thickness;
   a second metal layer formed above said one or more first metal layers, said second metal layer comprising power and signal routing lines having a second thickness that is greater than said first thickness; and
   one or more inductor metal layers formed above said semiconductor layer, said one or more inductor metal layers comprising inductor metal lines forming one or more inductors, said inductor metal lines of at least one inductor metal layer form a first inductor and a second inductor, said inductor metal lines having a third thickness that is greater than said second thickness.

2. The integrated circuit of claim 1, wherein each of said one or more inductor metal layers is positioned above said second metal layer.

3. The integrated circuit of claim 1, wherein one of said one or more inductor metal layers is positioned below said second metal layer.

4. The integrated circuit of claim 1, wherein a ratio defined by said third thickness and a minimum lateral dimension used in said one or more inductor metal layers is greater than a ratio defined by said second thickness and a minimum lateral dimension used in said second metal layer.

5. The integrated circuit of claim 1, wherein two or more inductor metal layers are provided.

6. The integrated circuit of claim 5, wherein at least two of said two or more inductor metal layers have metal lines with a different thickness.

7. The integrated circuit of claim 1, wherein said third thickness is 3 µm or more.

8. The integrated circuit of claim 7, wherein said third thickness is 4 µm or more.

9. The integrated circuit of claim 1, wherein said plurality of semiconductor circuit elements are part of a circuitry that comprises an analog circuit portion and a digital circuit portion.

10. The integrated circuit of claim 1, wherein a lateral dimension of said integrated circuit is defined by said plurality of semiconductor circuit elements formed in and above said semiconductor layer and by said first and second metal layers.

11. The integrated circuit of claim 1, wherein the second metal layer does not include an inductor element.

12. The integrated circuit of claim 1, wherein the semiconductor circuit elements form a part of a circuitry that comprises at least a first circuit portion and a second circuit portion, the integrated circuit further comprising:
    a first interconnect and a second interconnect, the first interconnect forming at least part of an electrical connection between the first inductor and the first circuit portion and the second interconnect forming at least part of an electrical connection between the second inductor and the second circuit portion.

13. The integrated circuit of claim 12, wherein:
    the power and signal routing lines comprise a first routing line and a second routing line;
    the first interconnect connects the first routing line with the first inductor; and
    the second interconnect connects the second routing line with the second inductor.

14. The integrated circuit of claim 12, wherein the first circuit portion comprises an analog circuit portion and the second circuit portion comprises a digital circuit portion.

15. The integrated circuit of claim 13, wherein the first circuit portion comprises an analog circuit portion and the second circuit portion comprises a digital circuit portion.

* * * * *